US009613712B1

United States Patent
Disegni et al.

(10) Patent No.: US 9,613,712 B1
(45) Date of Patent: Apr. 4, 2017

(54) NEGATIVE VOLTAGE MANAGEMENT MODULE FOR AN ADDRESS DECODER CIRCUIT OF A NON-VOLATILE MEMORY DEVICE

(71) Applicant: STMicroelectronics S.r.l, Agrate Brianza (IT)

(72) Inventors: Fabio Enrico Carlo Disegni, Spino d'adda (IT); Giuseppe Castagna, Palermo (IT); Maurizio Francesco Perroni, Furnari (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/212,208

(22) Filed: Jul. 16, 2016

(30) Foreign Application Priority Data

Oct. 22, 2015 (IT) .......................... 102015000064443

(51) Int. Cl.
*G11C 16/30* (2006.01)
*G11C 16/08* (2006.01)
*G11C 16/06* (2006.01)
*G11C 8/10* (2006.01)

(52) U.S. Cl.
CPC .............. *G11C 16/30* (2013.01); *G11C 16/06* (2013.01); *G11C 16/08* (2013.01); *G11C 8/10* (2013.01)

(58) Field of Classification Search
CPC ......... G11C 16/06; G11C 16/08; G11C 16/12; G11C 12/14; G11C 16/30; G11C 8/10
USPC ............ 365/185.18, 185.23, 189.09, 189.11, 365/230.06, 230.08, 226
See application file for complete search history.

(56) References Cited

U.S. PATENT DOCUMENTS

| 6,055,186 A | 4/2000 | Hung et al. |
| 6,434,080 B1 | 8/2002 | Shiga |
| 2007/0109876 A1* | 5/2007 | Umezawa .............. G11C 5/145 365/189.09 |

FOREIGN PATENT DOCUMENTS

EP 1646051 A1 4/2006

OTHER PUBLICATIONS

Campardo, G. et al., "Progettazione di Memorie Non Volatili (Design of non-volatile memories)," Franco Angeli, 2nd edition, Feb. 9, 2002, pp. 199-205.
Cappelletti, P. et al., "Flash Memories," Kluwer Academic Publishers, Jun. 30, 1999, pp. 257-259.

* cited by examiner

Primary Examiner — Tan T. Nguyen
(74) Attorney, Agent, or Firm — Slater Matsil, LLP

(57) ABSTRACT

An address decoder circuit is designed to address and bias memory cells of a memory array of a non-volatile memory device. The address decoder circuit includes a charge-pump stage configured to generate a boosted negative voltage. A control stage is operatively coupled to the charge-pump stage for controlling switching on/off thereof as a function of a configuration signal that determines the value of the boosted negative voltage. A decoding stage is configured so as to decode address signals received at its input and generate biasing signals for addressing and biasing the memory cells. A negative voltage management module has a regulator stage, designed to receive the boosted negative voltage from the charge-pump stage and generate a regulated negative voltage for the decoding stage, having a lower ripple as compared to the boosted negative voltage generated by the charge-pump stage.

20 Claims, 7 Drawing Sheets

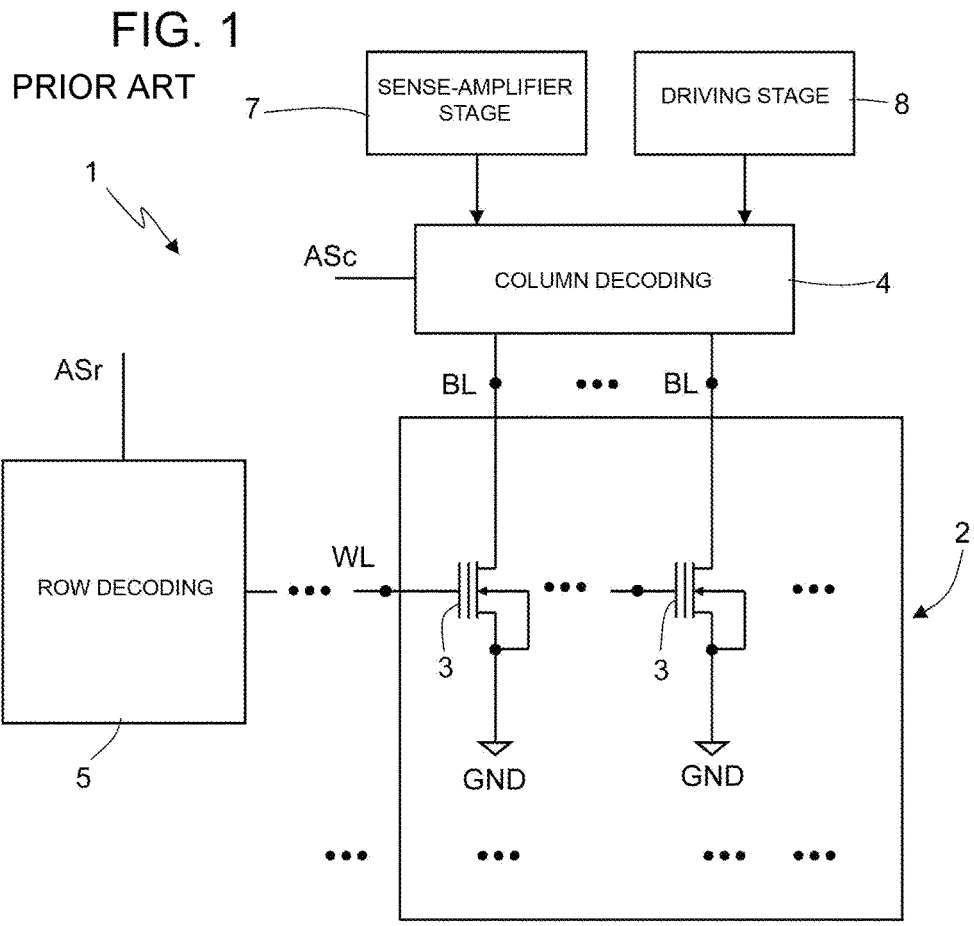
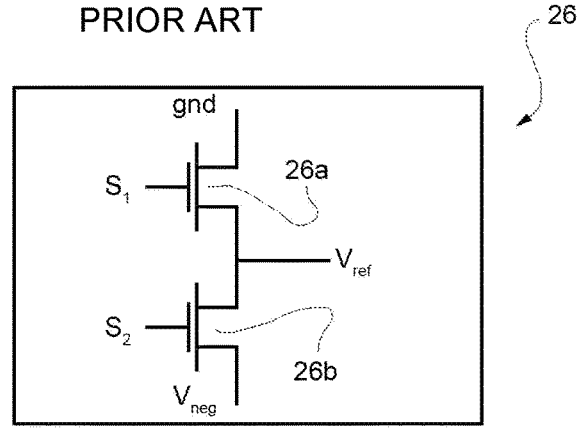

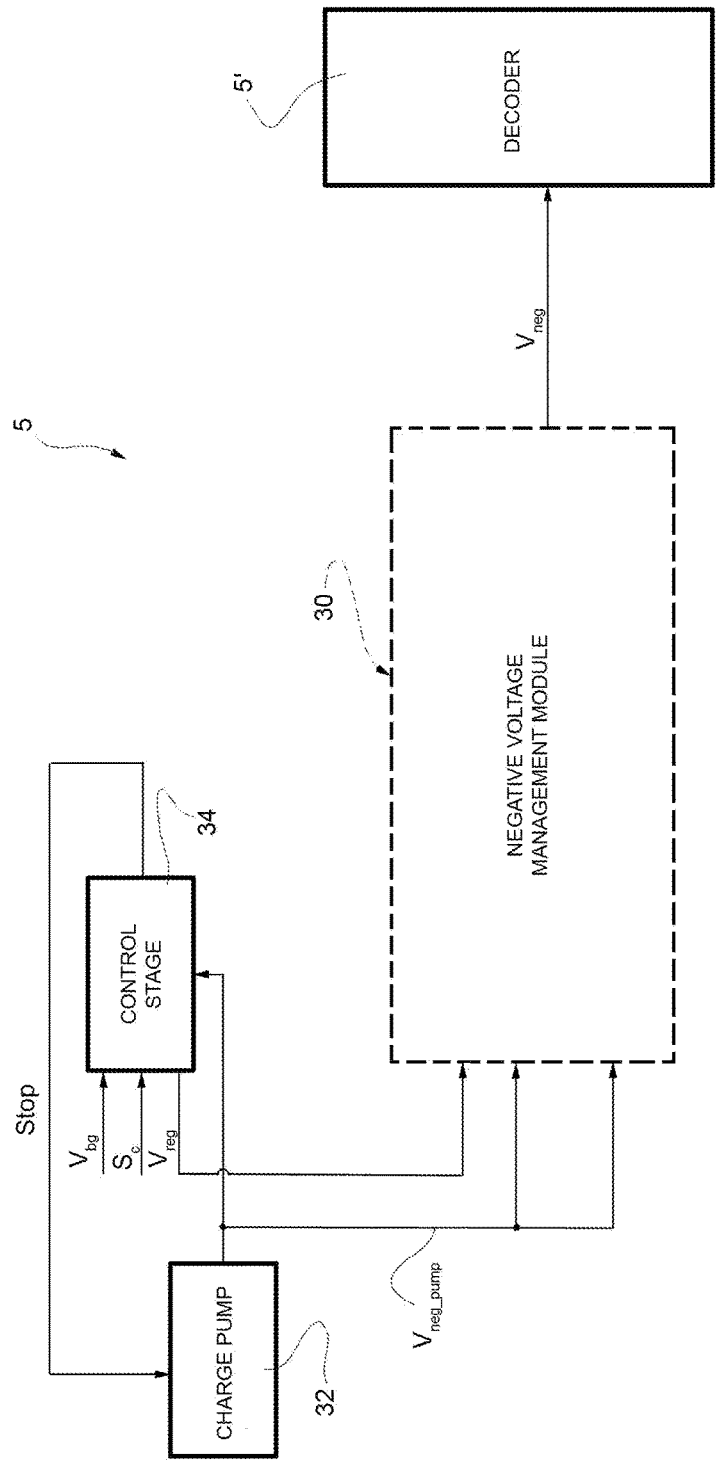

| $S_C$ | $V_{neg\_pump}$ | $V_{neg\_reg}$ | $V_{nwell}$ |
|---|---|---|---|
| 10011 | -3.285 | -0.635 | vdd |
| 00100 | -3.655 | -1.005 | vdd |
| 10100 | -3.885 | -1.235 | vdd |
| 00101 | -4.225 | -1.605 | vdd |
| 10101 | -4.495 | -1.845 | vdd |
| 00110 | -4.865 | -2.215 | 0 |
| 10110 | -5.105 | -2.455 | 0 |
| 00111 | -5.475 | -2.825 | 0 |
| 10111 | -5.705 | -3.055 | 0 |
| 01000 | -6.075 | -3.425 | 0 |
| 11000 | -6.315 | -3.665 | 0 |
| 01001 | -6.685 | -4.035 | 0 |

NEGATIVE VOLTAGE MANAGEMENT MODULE FOR AN ADDRESS DECODER CIRCUIT OF A NON-VOLATILE MEMORY DEVICE

This application claims priority to Italian Patent Application No. 102015000064443, filed on Oct. 22, 2015, which application is hereby incorporated herein by reference.

TECHNICAL FIELD

The present invention relates to a negative voltage management module for an address decoder circuit of a non-volatile memory device.

BACKGROUND

Memory devices include a memory array with rows and columns of memory cells. The columns can be selected by column decoders and the rows selected by row decoders.

Architectures of address decoders made in a way substantially similar to what is described below are described, for example, in:
P. Cappelletti, C. Golla, P. Olivo, E. Zanoni, "Flash Memories", Kluver Academic Publishers, 1999, Chapter 5.2; and
G. Campardo, "Progettazione di memorie non volatili", Franco Angeli 2002, pp. 199-205.

SUMMARY

A first embodiment discloses an address decoder circuit, designed to address and bias memory cells of a memory array of a non-volatile memory device. The address decoder circuit includes a charge-pump stage configured to generate a boosted negative voltage. A control stage is operatively coupled to the charge-pump stage for controlling switching on/off thereof as a function of a configuration signal that determines the value of the boosted negative voltage. A decoding stage is configured so as to decode address signals received at its input and generate biasing signals for addressing and biasing the memory cells, on the basis of the decoded address signals and, in at least one given operating condition, of the boosted negative voltage. A negative voltage management module has a regulator stage, designed to receive the boosted negative voltage from the charge-pump stage and generate a regulated negative voltage for the decoding stage, having a lower ripple as compared to the boosted negative voltage generated by the charge-pump stage.

Another embodiment provides an address-decoding method for addressing memory cells of a memory array of a non-volatile memory device. A boosted negative voltage is generated via a charge-pump stage. The charge-pump stage is switched on and switched off as a function of a configuration signal that determines the value of the boosted negative voltage. Address signals are received in decoded so as to generate biasing signals for addressing and biasing the memory cells, on the basis of the decoded address signals and, in at least one given operating condition, of the boosted negative voltage. A regulated negative voltage is generated for the decoding stage, starting from the boosted negative voltage received from the charge-pump stage. The regulated negative voltage has a lower ripple as compared to the boosted negative voltage generated by the charge-pump stage.

BRIEF DESCRIPTION OF THE DRAWINGS

For a better understanding of the present invention, preferred embodiments thereof are now described, purely by way of non-limiting example, with reference to the attached drawings, wherein:
FIG. 1 shows an overall block diagram of a non-volatile memory device of a known type;
FIG. 3 shows a block diagram of a selector module associated to the decoder of FIG. 2;
FIG. 4 shows an overall block diagram of an address decoder circuit including a negative voltage management module, according to one embodiment of the present solution;
FIG. 7b shows in greater detail one embodiment of the regulator stage of FIG. 7a.

DETAILED DESCRIPTION OF ILLUSTRATIVE EMBODIMENTS

Figure 2:
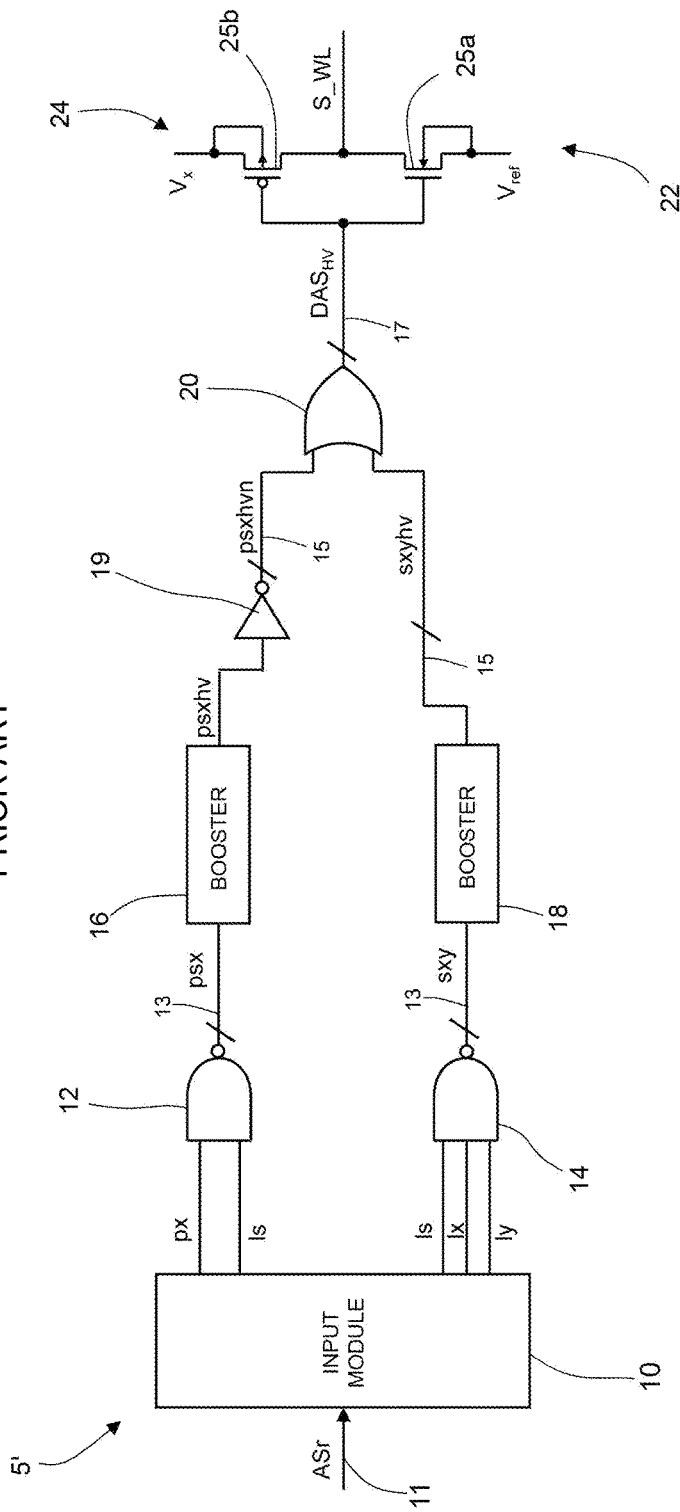
FIG. 2 shows an overall block diagram of a row decoder in the memory device of FIG. 1, which is also of a known type.

The present invention relates to a negative voltage management module for an address decoder circuit of a non-volatile memory device, in particular of a flash type. The present disclosure will make reference, without this implying any loss of generality, to a row-decoder circuit for addressing and biasing rows of the memory array of the non-volatile memory device.

As it is known, and as shown schematically in FIG. 1, a non-volatile memory device, designated by 1, for example of a NAND or NOR flash type, generally comprises a memory array 2 made up of a plurality of memory cells 3, arranged in rows (word lines WL) and columns (bit lines BL).

Each memory cell 3 is constituted by a storage element formed by a floating-gate transistor, having a gate terminal designed to be coupled to a respective word line WL, a first conduction terminal designed to be coupled to a respective bit line BL, and a second conduction terminal connected to a reference potential (for example, ground GND). In particular, gate terminals of memory cells 3 of a same word line WL are connected together.

In a way not illustrated, the memory array 2 is generally arranged in a plurality of sectors, each of which comprises a plurality of memory cells 3. Each sector has a plurality of respective word lines WL, which are distinct from those of the other sectors and are physically connected to the memory cells 3 present in the same sector.

A column-address decoder circuit 4 and a row-address decoder circuit 5 enable selection, on the basis of address signals received at their input (generated in a per se known manner and designated as a whole by AS, namely, $AS_r$ for the rows and $AS_c$ for the columns), the memory cells 3, and in particular the corresponding word lines WL and bit lines BL, each time addressed in the various sectors, enabling biasing thereof at appropriate voltage and current values during memory operations.

The column-address decoder circuit 4 may further be configured to internally provide two paths towards the bit lines BL of the memory array 2 each time selected: a reading path, designed to create a conductive path between the selected bit line BL and a sense-amplifier stage 7, which is designed to compare the current circulating in the addressed memory cell 3 with a reference current in order to determine the datum stored; and a programming path, designed to create a conductive path between the selected bit line BL and a driving stage 8, which is configured to supply the required biasing quantities.

In the specific case of non-volatile memories of a flash type, it is known that certain memory operations require high, positive or negative, values of the biasing voltages applied to the word lines WL, for example voltages boosted in the high-voltage (HV) range, for example ranging, in absolute value, between 2 V and 9 V. These high values of the biasing voltages are generated inside the memory device by charge-pump stages, which generate boosted voltages starting from a supply voltage Vdd, having a logic value, for example a low voltage (LV) of 1.2 V.

In greater detail, and as shown schematically in FIG. 2, in a known embodiment, the row-address decoder circuit comprises a row decoder 5' having an input module 10, which receives the row-address signals $AS_r$, being digital signals having a certain number of bits, from an input address bus 11, and appropriately groups the bits of the row-address signals $AS_r$ into subsets in order to generate low-voltage grouped address signals.

The row-address signals $AS_r$ (for example, nine-bit digital signals) are grouped to form first address signals px, second address signals lx, third address signals ly, and fourth address signals ls.

For example, considering a row-address signal $AS_r$<8:16>, the first address signals px may correspond to the three bits $AS_r$<8:10>, the second address signals ly may correspond to the two bits $AS_r$<11:12>, and the third address signals lx may correspond to the remaining four bits $AS_r$<13:16>.

In the example, the fourth address signals ls may indicate the sector of the memory array 2 that is to be selected, the first address signals px may indicate a block (in the example of eight word lines WL) to be addressed within the sector, and the second and third address signals lx and ly may indicate the specific word line WL to be addressed within the selected block.

The row decoder 5' comprises a pre-decoding module, provided with a plurality of first logic gates 12 and a plurality of second logic gates 14.

The first logic gates 12 are of a NAND type with two inputs and one output, each of which receives at the inputs a respective first address signal px and a respective fourth address signal ls and supplies at the output a respective first low-voltage predecoded address signal, here designated by psx. In the example described, the first logic gates 12 are eight in number (i.e., equal in number to the combinations that may be obtained starting from the address signals received at the input).

The second logic gates 14 are of a NAND type with three inputs and one output, each of which receives at the inputs a respective second address signal lx, a respective third address signal ly, and a respective fourth address signal ls, and supplies at the output a second low-voltage predecoded address signal, here designated by sxy. In the example described, the second logic gates 14 are sixty-four in number (i.e., once again equal in number to the combinations that may be obtained starting from the address signals received at the input).

The row decoder 5' further comprises a voltage-booster module, comprising a plurality of first voltage-booster stages 16 and a plurality of second voltage-booster stages 18, connected to the first and second logic gates 12, 14, respectively, through a first transport bus 13.

The first transport bus 13 comprises in this case eight lines for the first low-voltage predecoded address signals psx, and sixty-four lines for the second low-voltage predecoded address signals sxy, which are received at the input of the voltage-booster module.

Each of the first voltage-booster stages 16 has an input that receives a respective first low-voltage predecoded address signal psx and an output that supplies a respective first predecoded address signal psxhv, having a high voltage. In the example, the first voltage-booster stages 16 are eight in number.

Each of the second voltage-booster stages 18 has an input that receives a respective second low-voltage predecoded address signal sxy and an output that supplies a respective second predecoded address signal sxyhv, having a high voltage. In the example, the second voltage-booster stages 18 are sixty-four in number.

The row decoder 5' further comprises a decoding module, which receives the predecoded address signals and combines them logically in an appropriate way so as to generate decoded address signals $DAS_{HV}$, which are also high-voltage signals, on an output bus 17, which includes a number of lines corresponding to the number of word lines WL of the addressed sector of the memory array 2.

The decoding module is provided with a plurality of buffer stages 19, which operate as inverters, each of which receives a first predecoded address signal psxhv and supplies at output, on a second transport bus 15 including a number of lines corresponding to the number of lines of the first transport bus 13, the negated version of the same first predecoded address signal, designated by psxhvn. For example, in the embodiment illustrated, one hundred and twenty-eight buffer stages 19 are present (which enable appropriate increase of the fan out at the output of the first voltage-booster stages 16).

The decoding module further comprises a plurality of logic-combination stages 20, each having: a first input that receives a respective first, negated, predecoded address signal psxhvn from a respective buffer stage 19; a second input that receives a respective second predecoded address signal sxyhv from a respective second voltage-booster stage 18; and an output that supplies a respective decoded address signal $DAS_{HV}$.

Each logic-combination stage 20 implements an OR logic operation between the predecoded address signals to be combined received at the input: psxhvn and sxyhv.

The decoded address signal $DAS_{HV}$ thus has a high value (high voltage) when any one, or both, of the predecoded address signals to be combined psxhvn and sxyhv has or have a high value; and a low value (ground, gnd) when both of the predecoded address signals to be combined psxhvn and sxyhv have a low value.

In the embodiment illustrated, the logic-combination stages 20 are five hundred and twelve in number, i.e., equal to the number of the word lines WL to be addressed (and to the total number of combinations between the predecoded address signals to be combined psxhvn and sxyhv).

The row decoder 5' further comprises a driving module 22, which receives the decoded address signals $DAS_{HV}$ from the output bus 17 and generates appropriate biasing signals S_WL, at high voltage, for the respective word lines WL of the sector of the memory array 2, for enabling addressing and biasing of the corresponding memory cells 3.

The driving module 22 of the row decoder 5' comprises in this embodiment a plurality of inverters 24, each having an input that receives a respective decoded address signal $DAS_{HV}$ and an output that supplies the corresponding biasing signal S_WL for the respective word line WL of the memory array 2. The number of inverters 24 is equal to the number of the word lines WL to be addressed, in the example five hundred and twelve.

In detail, each inverter 24 comprises a first output transistor 25a, of an NMOS type, having its control terminal that receives the respective decoded address signal $DAS_{HV}$, its drain terminal which is connected to a respective word line WL and on which the corresponding biasing signal S_WL is present, and its source terminal that receives a reference voltage $V_{ref}$; and a second output transistor 25b, of a PMOS type, having its gate terminal that receives the respective decoded address signal $DAS_{HV}$, its drain terminal which is connected to the respective word line WL and on which the corresponding biasing signal S_WL is present, and its source terminal that receives a boosted voltage, here designated by $V_x$, in the high-voltage range, for example with a value of 4.5 V.

A high output of the inverter 24 corresponds to a low value of the decoded address signal $DAS_{HV}$, with the corresponding biasing signal S_WL equal to the boosted voltage $V_x$. Instead, a low output of the inverter 24 corresponds to a high value of the decoded address signal $DAS_{HV}$, with the corresponding biasing signal S_WL equal to the reference voltage $V_{ref}$.

The value of the reference voltage $V_{ref}$ may be equal to the ground reference gnd or, in given operating conditions, to a negative voltage $V_{neg}$ with boosted value. In particular, it is known that during read/verify operations on flash memory cells, a voltage with negative boosted value is applied to the non-selected word lines WL.

Thus, in the row decoder 5' a selector stage 26 (shown in FIG. 3) is provided, which comprises: a first selection transistor 26a, of an NMOS type, which has a first conduction terminal connected to the ground reference gnd, a second conduction terminal that is connected to an output terminal and supplies the reference voltage $V_{ref}$ for the driving module 22, and a control terminal that receives a first selection signal $S_1$; and a second selection transistor 26b, of an NMOS type, which has a first conduction terminal that receives the negative voltage $V_{neg}$ (directly from a charge-pump stage, here not illustrated), a second conduction terminal that is connected to the output terminal and supplies the reference voltage $V_{ref}$, and a control terminal that receives a second selection signal $S_2$.

When the first selection signal $S_1$ is high (and the second selection signal $S_2$ is low), the reference voltage $V_{ref}$ has the value of the ground reference gnd. When, instead, the first selection signal $S_1$ is low (and the second selection signal $S_2$ is high), the reference voltage $V_{ref}$ has the value of the negative voltage $V_{neg}$, appropriately generated by the charge-pump stage. The values of the selection signals $S_1$, $S_2$ are appropriately provided by a management unit of the non-volatile memory device 1, here not illustrated.

The present Applicant has realized that the address-decoding solution described previously has some limitations, in particular linked to management of the negative voltage $V_{neg}$, with boosted value, for generation of the reference voltage $V_{ref}$ for the non-selected word lines WL of the memory array 2.

The present Applicant has in fact realized that a part of the ripple present on the reference voltage $V_{ref}$ (in the case where this has the value of the negative voltage $V_{neg}$) is transmitted, as a result of the capacitive coupling between gate and source in the output transistors 25a, 25b, onto the selected word line (coupled to the boosted positive voltage $V_x$), even to the point of jeopardizing proper execution of the memory operations.

Embodiments of the present invention solve, at least in part, the problem highlighted previously by providing a more effective solution for management of the negative voltage in the address decoder.

With reference to FIG. 4, an address decoder circuit of a non-volatile memory device (here not illustrated; see e.g. FIG. 1), for example of a flash type, is now disclosed. The address decoder circuit may, for example, include the row decoder 5', receiving and designed to decode the address signals $AS_r$, which has been described previously with reference to FIG. 2 (not described again in detail here) and is thus designated once again by reference number 5.

According to one aspect of the present solution, the address decoder circuit 5 further comprises a negative voltage management module, designated as a whole by 30.

The negative voltage management module 30 is configured to supply to the row decoder 5' the negative voltage $V_{neg}$ at which to bias, in given operating conditions, the word lines WL of the memory array 2. In particular, as discussed previously, the negative voltage $V_{neg}$ may be used for generation of the reference voltage $V_{ref}$ at which to bias the non-selected word lines WL during the read/verify operations.

The negative voltage management module 30 receives at the input, from a charge-pump stage 32 (of a known type, not described in detail herein), a boosted negative voltage $V_{neg\_pump}$, having a negative value that is a function of the memory operation that is to be carried out, for example comprised between −9 V and −2 V.

As will be discussed in greater detail hereinafter, the charge-pump stage 32 is operatively coupled to a control stage 34, which controls alternately switching-on/switching-off thereof in order to reach a desired value of the boosted negative voltage $V_{neg\_pump}$.

In particular, the control stage 34 supplies to the charge-pump stage 32 a stop signal Stop designed to time the off times and on times thereof, and further receives: a configuration signal $S_c$, for example from a management unit (not illustrated herein) of the non-volatile memory device 1, indicative of the desired value for the boosted negative voltage $V_{neg\_pump}$; a voltage reference $V_{bg}$, for example from a voltage generator of a band-gap type (of a known type, not illustrated herein), which constitutes a voltage reference having a value that is stable and invariant in time and as the operating conditions vary; and further, from the charge-pump stage 32, the boosted negative voltage $V_{neg\_pump}$ in order to implement a feedback control of the value of the same boosted negative voltage $V_{neg\_pump}$.

According to one aspect of the present solution, the negative voltage management module 30 receives at the input, from the control stage 34, a regulation voltage $V_{reg}$, generated inside the same control stage 34, and is configured to generate, on the basis of the regulation voltage $V_{reg}$, a regulated negative voltage (substantially without ripple) $V_{neg\_reg}$ designed to define the negative voltage $V_{neg}$ for biasing the word lines WL of the memory array 2, in at least certain operating conditions, for example during the aforesaid read/verify operations.

As will be described in detail hereinafter, the same regulation voltage $V_{reg}$ is used within the control stage 34 for regulating the value of the boosted negative voltage $V_{neg\_pump}$.

Figure 5:
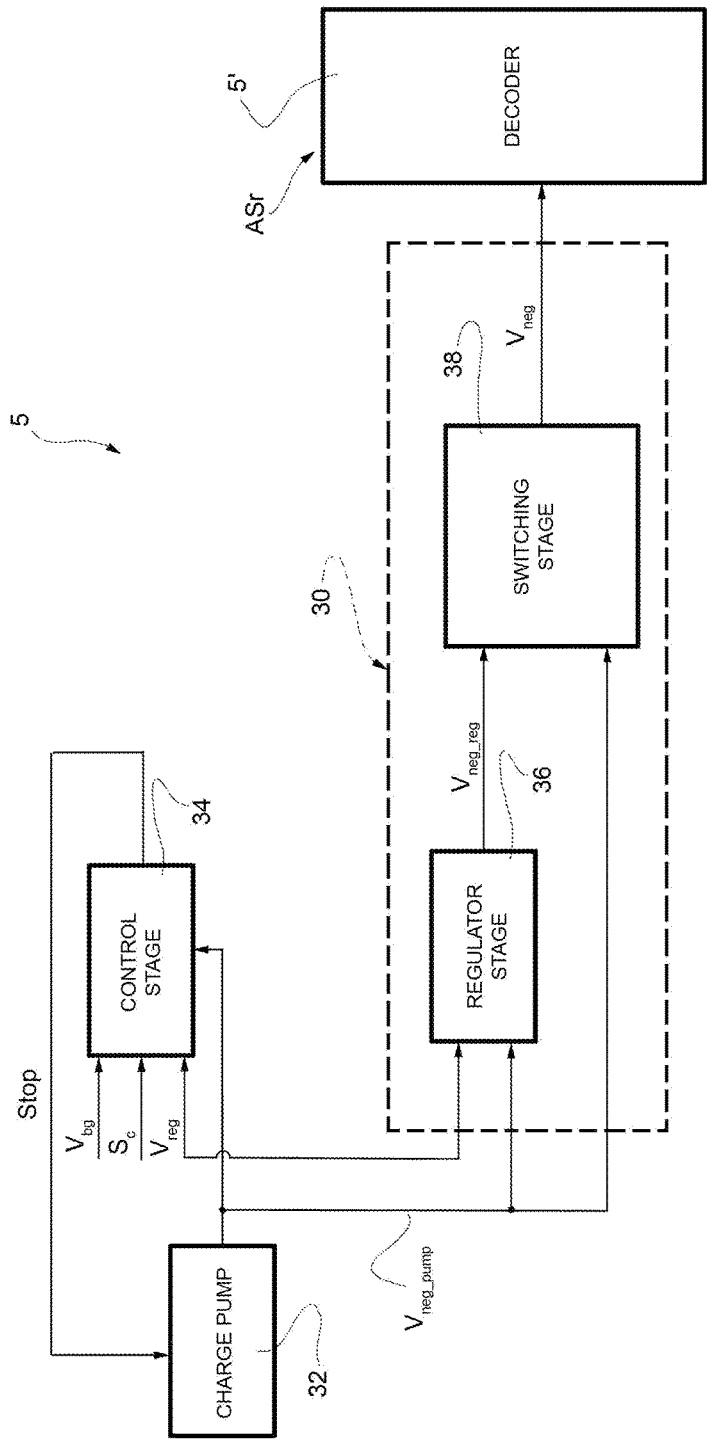
FIG. 5 shows in greater detail the block structure of the negative voltage management module in the address decoder circuit of FIG. 4.

In a possible embodiment, illustrated in FIG. 5, the negative voltage management module 30 comprises: a regulator stage 36, which receives at the input the boosted negative voltage $V_{neg\_pump}$ from the charge-pump stage 32 and the regulation voltage $V_{reg}$ from the control stage 34, to generate the regulated negative voltage $V_{neg\_reg}$, without ripple so that it satisfies the following expression:

$$V_{neg\_reg} = V_{neg\_pump} + \Delta V$$

wherein $\Delta V$ is a voltage deviation of a desired value with respect to the boosted negative voltage $V_{neg\_pump}$.

According to one aspect of the present solution, the voltage deviation $\Delta V$ is generated starting from the regulation voltage $V_{reg}$ and in particular is equal to an integer multiple, or to a fraction, of the voltage reference $V_{bg}$.

The negative voltage management module 30 further comprises a switching stage 38, operating at high voltage, which receives at the input the boosted negative voltage $V_{neg\_pump}$ from the charge-pump stage 32 and the regulated negative voltage $V_{neg\_reg}$ from the regulator stage 36, and supplies at the output alternatively the boosted negative voltage $V_{neg\_pump}$ or the regulated negative voltage $V_{neg\_reg}$ as the negative voltage $V_{neg}$ to be used as reference voltage $V_{ref}$ for biasing the word lines WL of the memory array 2, in given operating conditions.

In particular, as discussed previously, the switching stage 38 may be operated for supplying at the output, as the negative voltage $V_{neg}$, the regulated negative voltage $V_{neg\_reg}$ at least during the read/verify operations for biasing non-selected word lines WL of the memory array 2.

In particular, the solution described thus makes it possible to obtain two distinct values for the negative biasing voltage $V_{neg}$ for biasing the word lines WL, i.e., the boosted negative voltage $V_{neg\_pump}$ or the regulated negative voltage $V_{neg\_reg}$, using a single control signal $S_c$, i.e., without further control actions required of the management unit of the non-volatile memory device 1.

Figure 6:
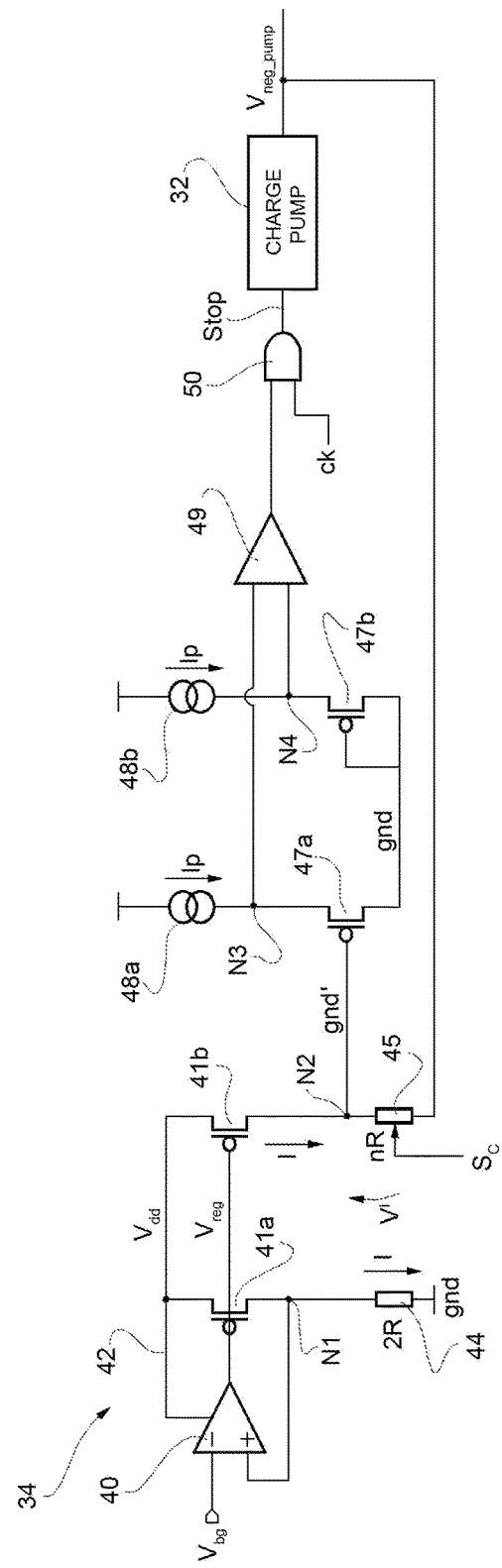
FIG. 6 shows a circuit diagram of a charge-pump stage in the address decoder circuit of FIG. 4.

With reference to FIG. 6, the circuit configuration of the control stage 34 is first described in greater detail; the control stage 34 comprises:

an input operational amplifier 40, having a first input that receives the voltage reference $V_{bg}$, a second input connected to a first internal node $N_1$, and an output;

a first matched transistor 41a, of a PMOS type, which is connected between a supply terminal 42 set at the supply voltage Vdd (low voltage) and the first internal node $N_1$ and has its control terminal connected to the output of the input operational amplifier 40, on which, during operation, the regulation voltage $V_{reg}$ is present;

a second matched transistor 41b, which is connected between the same supply terminal 42 and a second internal node $N_2$ and has its control terminal which is also connected to the output of the input operational amplifier 40;

a reference resistor 44, which has a pre-set value of resistance 2R and is connected between the first internal node $N_1$ and a ground reference terminal gnd;

a regulation resistor 45, which is connected between the second internal node $N_2$ and the output of the charge-pump stage 32 from which it receives, as a feedback, the boosted negative voltage $V_{neg\_pump}$, and having a value of resistance nR that is variable as a function of the control signal $S_c$, which determines in particular the value of the (integer) multiplying factor n, i.e., the ratio between the values of resistance 2R and nR of the reference resistor 44 and of the regulation resistor 45, respectively;

a first comparison transistor 47a, of a PMOS type, which is connected between the ground reference terminal gnd and a third internal node $N_3$ and has its control terminal connected to the second internal node $N_2$;

a second comparison transistor 47b, which is also of a PMOS type, is connected between the ground reference terminal gnd and a fourth internal node $N_4$, and has its control terminal connected to the same ground reference terminal gnd;

a pair of current-reference generators 48a, 48b, designed to supply a same biasing current $I_P$ on the third and fourth internal nodes $N_3$, $N_4$;

a comparison amplifier 49, which has a first input connected to the third internal node $N_3$, a second input connected to the fourth internal node $N_4$, and an output; and an AND logic gate 50, which has a first input connected to the output of the comparison amplifier 49, a second input that receives a clock signal ck, and an output that is connected to the input of the charge-pump stage 32 and supplies the stop signal Stop.

Operation of the control stage 34 envisages that, during operation, the voltage reference $V_{bg}$ is present on the internal node $N_1$, determining, through the reference resistor 44, a regulation current I.

Given that both of the matched transistors 41a, 41b have their control terminals receiving the same regulation voltage $V_{reg}$, the regulation current I is further present on the second internal node $N_2$, thus determining on the regulation resistor 45 a voltage drop that is n/2 times the voltage reference $V_{bg}$:

$$V' = V_{bg} \cdot n/2$$

It should be noted that this voltage represents, on the second internal node $N_2$, an unbalancing voltage V' with respect to the value of the boosted negative voltage $V_{neg\_pump}$ received at the input from the charge-pump stage 32.

Operation of the comparison transistors 47a, 47b and of the comparison amplifier 49 envisages reaction to the unbalancing voltage V' so as to bring the boosted voltage $V_{neg\_pump}$ to the desired value (determined by the control signal $S_c$).

In particular, the second internal node $N_2$ defines a virtual-ground node gnd'. As soon as the voltage on this virtual-ground node exceeds the ground reference gnd, the output of the comparison amplifier 49 switches, thus determining switching of the output of the AND logic gate 50 (timed by the clock signal ck), and consequently switching-on of the charge-pump stage 32. The same charge-pump stage 32 remains on until the boosted negative voltage $V_{neg\_pump}$ has reached the desired value.

The value of the boosted negative voltage $V_{neg\_pump}$ may thus be regulated in steps of variation equal to $V_{bg}/2$, as a function of the value of the control signal $S_c$ that acts on the value of resistance of the regulation resistor 45.

The operation described, of an on/off type, of the charge-pump stage 32 determines the presence of a ripple disturbance on the boosted negative voltage $V_{neg\_pump}$.

Figure 7A:
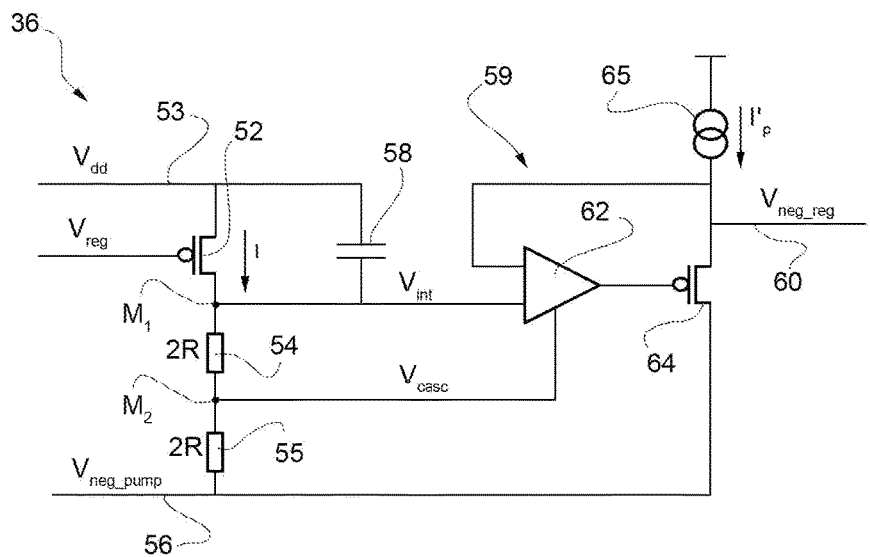
FIG. 7a shows a circuit diagram of a regulator stage in the negative voltage management module.

With reference first to FIG. 7a, the structure of the regulator stage 36 of the negative voltage management module 30 is now described in greater detail, having the purpose of eliminating, or at least reducing, the effects of the ripple on the boosted negative voltage $V_{neg\_pump}$.

The regulator stage 36 comprises:

a regulation transistor 52, of a PMOS type, which is connected between a supply terminal 53 set at the supply voltage Vdd and a first internal node $M_1$, and has its control terminal receiving the regulation voltage $V_{reg}$ from the control stage 34 (i.e., the same voltage as the one present on the control terminals of the matched transistors 41a, 41b of the same control stage 34, see FIG. 6);

a first reference resistor 54, which is connected between the first internal node $M_1$ and a second internal node $M_2$ and has a value of resistance 2R (i.e., the same value of resistance as that of the reference resistor 44 of the control stage 34);

a second reference resistor 55, which is connected in series to the first reference resistor 54, between the second internal node $M_2$ and an input terminal 56 that receives the boosted negative voltage $V_{neg\_pump}$ from the charge-pump stage 32, and having a value of resistance 2R (i.e., the same value of resistance as that of the first reference resistor 54);

a filter capacitor 58, connected between the supply terminal 53 and the first internal node $M_1$;

a voltage-follower block 59, which is connected to the first internal node $M_1$ and to the second internal node $M_2$, and is designed to supply, on an output 60 of the regulator stage 36, the regulated negative voltage $V_{neg\_reg}$ so that it satisfies the previously indicated expression:

$$V_{neg\_reg}=V_{neg\_pump}+\Delta V$$

where $\Delta V$ is the voltage deviation of a desired value.

In particular, the voltage-follower block 59 comprises:

a linear amplifier 62, having a first differential input, which is connected to the first internal node $M_1$ and receives an internal voltage $V_{int}$ present on the same first internal node $M_1$, a second differential input connected to the output 60 of the regulator stage 36, a biasing input, which is connected to the second internal node $M_2$ and receives a biasing voltage $V_{case}$ present on the same second internal node $M_2$, and a respective output;

an output transistor 64, of a PMOS type in source-follower configuration, which is coupled between the input terminal 56 and the output 60 of the regulator stage 36 and has its control terminal connected to the respective output of the linear amplifier 62; and a biasing-current generator 65, designed to supply a respective biasing current $I_P'$ of appropriate value for biasing of the output transistor 64.

In particular, the regulation transistor 52 is made to be matched to the matched transistors 41a, 41b so that, given the presence of a same regulation voltage $V_{reg}$ on its control terminal, flow of a same current I towards the first internal node $M_1$ occurs.

Consequently, during operation, both on the first reference resistor 54 and on the second reference resistor 54, 55 a voltage drop is obtained, equal to the voltage reference $V_{bg}$, with stable and pre-set value. Consequently, the following relations apply:

$$V_{int}=V_{neg\_pump}+2\cdot V_{bg}; \text{ and}$$

$$V_{case}=V_{neg\_pump}+V_{bg}$$

For example, in the case where the boosted negative voltage $V_{neg\_pump}$ is −6.4 V, the internal voltage $V_{int}$ is −4 V, whereas the biasing voltage $V_{case}$ is −5.2 V (in any case, both the internal voltage $V_{int}$ and the biasing voltage $V_{case}$ have a voltage value determined in a stable and accurate way starting from the value of the boosted negative voltage $V_{neg\_pump}$, which is in turn determined by the value of the configuration signal $S_c$ in the control stage 34).

Operation of the voltage-follower stage 59 is such that the value of the regulated negative voltage $V_{neg\_reg}$ on the output 60 is equal to the value of the internal voltage $V_{int}$; namely, $$V_{neg\_reg}=V_{int}=V_{neg\_pump}+2\cdot V_{bg}$$

In particular, it is underlined that the resistor-capacitor (RC) group formed by the first and second reference resistors 54, 55 with the filter capacitor 58 advantageously enables implementation of a (low-pass) filtering action on the disturbance (ripple) present on the boosted negative voltage $V_{neg\_pump}$. In addition, the same linear amplifier 62, with its own transfer function, contributes to filtering of the disturbance present on the same boosted negative voltage $V_{neg\_pump}$.

Therefore, a considerable reduction of disturbance on the value of the internal voltage $V_{int}$, and thus on the value of the regulated negative voltage $V_{neg\_reg}$, occurs as a whole.

Figure 7B:
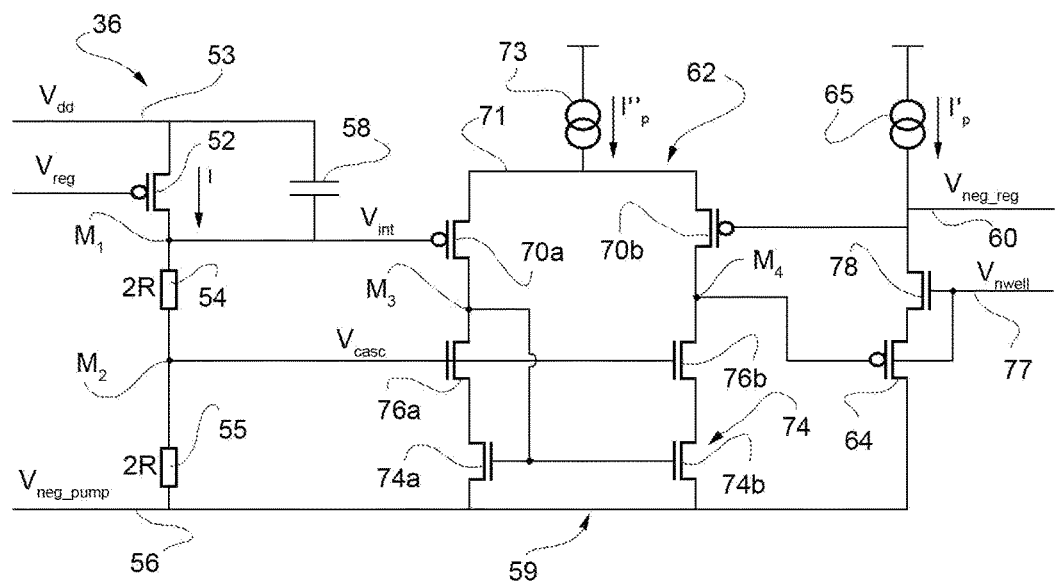

As described in greater detail in FIG. 7b, the linear amplifier 62 of the voltage-follower block 59 comprises:

a differential pair of input transistors 70a, 70b, of a PMOS type, of which a first differential input transistor 70a is connected between an input terminal 71, receiving a biasing current $I_P''$ from a further biasing-current generator 73, and a third internal node $M_3$, and has its control terminal connected to the first internal node $M_1$ and receiving the internal voltage $V_{int}$; and a second differential input transistor 70b, which is connected between the input terminal 71 and a fourth internal node $M_4$ and has its control terminal connected to the output 60 and supplying the regulated negative voltage $V_{neg\_reg}$; and a current mirror 74 formed by: a first mirror transistor 74a, of an NMOS type, which is connected between the input terminal 56 and the third internal node $M_3$, via interposition of a first protection transistor 76a, and has its control terminal connected to the same third internal node $M_3$; and a second mirror transistor 74b, which is also of an NMOS type, is connected between the input terminal 56 and the fourth internal node $M_4$, via interposition of a second protection transistor 76b, and has its control terminal connected to the control terminal of the first mirror transistor 74a.

In particular, the first and second protection transistors 76a, 76b, of an NMOS type, have their control terminals that are connected to the second internal node M2 and receiving the biasing voltage $V_{case}$.

In the embodiment illustrated in FIG. 7b, the regulator stage 36 further comprises a third protection transistor 78, of an NMOS type, which is arranged between the output 60 of the regulator stage 36 and the output transistor 64 and has its control terminal connected to a further input terminal 77, which receives a respective biasing voltage $V_{nwell}$, of an appropriate value, which is a function of the control signal $S_c$.

In use, the aforesaid third protection transistor 78 guarantees proper biasing of the output transistor 64, preventing, in particular, direct conduction between the corresponding source and drain terminals, during the switching-on transients.

The advantages of the solution proposed are clear from the foregoing description.

In any case, it is again emphasized that the present solution makes it possible to eliminate, or reduce considerably, the ripple present on the negative voltage $V_{neg}$ used for generation of the reference voltage $V_{ref}$ in addressing the memory array 2, thus preventing any possible errors in execution of the memory operations.

Thanks to the reduction of the effects of the ripple present on the boosted negative voltage $V_{neg\_pump}$, sizing of the charge-pump stage 32 with particular reference to the filter capacitance is less critical; it is for example possible to reduce the capacitance of the capacitors used in the charge-pump stage 32, with consequent reduction of the area occupied.

Furthermore, the solution described advantageously makes it possible to obtain, starting from a single configuration signal $S_c$, two distinct negative voltage references, the boosted negative voltage $V_{neg\_pump}$ and the regulated negative voltage $V_{neg\_reg}$, which may be kept separate at different voltage values, on the basis of the requirements of the memory operations, or possibly also be shorted to a same value.

Figures 8A, 8B:
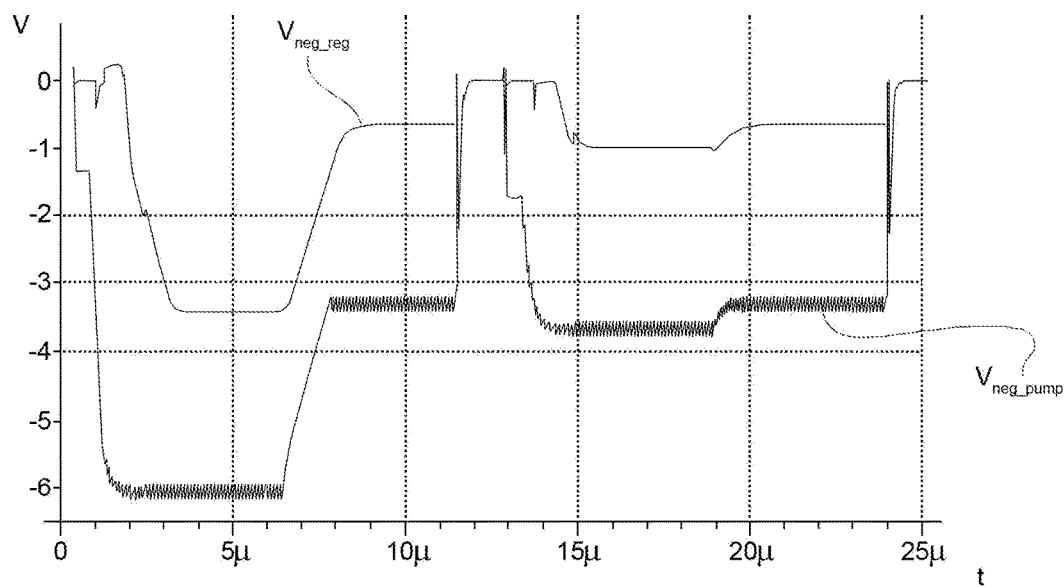
FIG. 8a shows comparative plots of a regulated negative voltage generated by the negative voltage management module and of a boosted negative voltage generated by the charge-pump stage.
FIG. 8b shows a table of possible values assumed by the regulated negative voltage and by the boosted negative voltage as a function of a same control signal.

FIG. 8a compares the plot of the boosted negative voltage $V_{neg\_pump}$ with that of the regulated negative voltage $V_{neg\_reg}$, highlighting the evident reduction in ripple.

The Table in FIG. 8b shows, instead, possible values for the above boosted negative voltage $V_{neg\_pump}$ and regulated negative voltage $V_{neg\_reg}$, as a function of the value of the configuration signal $S_c$. In this Table, the value assumed by the biasing voltage $V_{nwell}$ of the protection transistor 78 of the regulator stage 36 is shown, in this possible embodiment as a function of the configuration signal $S_c$.

Finally, it is clear that modifications and variations may be made to what has been described and illustrated herein, without thereby departing from the scope of the present invention, as defined in the annexed claims.

In particular, the circuit configuration of the regulator stage 36 and of the corresponding linear amplifier 62 may differ from the one illustrated, in any case maintaining the function of generation of the regulated negative voltage $V_{neg\_reg}$, using the same configuration signal 5, as the one used in the control stage 34 associated to the charge-pump stage 32.

For example, the value of resistance of the first and second reference resistors 54, 55 could differ from the value of resistance 2R of the reference resistor 44 of the control stage 34, being in any case a function of this value, for enabling generation of an internal voltage $V_{int}$ with a voltage deviation $\Delta V$ with respect to the boosted negative voltage $V_{neg\_pump}$ having a desired value that is a function of the reference voltage $V_{bg}$.

It is further emphasized that the solution described may be applied in various types of address decoders, for example also in column decoders, and in a wide range of non-volatile memory devices (for example, embedded or stand-alone flash devices), in which a reduced occupation of area is required.

What is claimed is:

1. An address decoder circuit, designed to address and bias memory cells of a memory array of a non-volatile memory device, the circuit comprising:
    a charge-pump stage configured to generate a boosted negative voltage;
    a control stage, operatively coupled to the charge-pump stage to control switching on/off the charge-pump stage as a function of a configuration signal that determines the value of the boosted negative voltage;
    a decoding stage, configured so as to decode address signals received at its input and to generate biasing signals for addressing and biasing the memory cells, based on the decoded address signals and, in at least one given operating condition, of the boosted negative voltage; and
    a negative voltage management module having a regulator stage, configured to receive the boosted negative voltage from the charge-pump stage and to generate a regulated negative voltage for the decoding stage, having a lower ripple as compared to the boosted negative voltage generated by the charge-pump stage.

2. The circuit according to claim 1, wherein the negative voltage management module further comprises a switching stage, which is configured to receive the boosted negative voltage from the charge-pump stage and the regulated negative voltage from the regulator stage and is configured to supply alternatively the boosted negative voltage or the regulated negative voltage to the decoding stage as negative voltage to which biasing the memory cells in the at least one given operating condition.

3. The circuit according to claim 1, wherein the regulator stage is configured to generate the regulated negative voltage having a value determined by the same configuration signal used by the control stage for determining the value of the boosted negative voltage.

4. A non-volatile memory device, comprising a memory array, and an address decoder circuit according to claim 1, the address decoder circuit coupled to the memory array and designed to address and bias the memory cells of the memory array.

5. The memory device according to claim 4, wherein the address decoder circuit implements a row decoder for addressing word lines of the memory array.

6. An address decoder circuit, designed to address and bias memory cells of a memory array of a non-volatile memory device, the circuit comprising:
    a charge-pump stage configured to generate a boosted negative voltage;
    a control stage, operatively coupled to the charge-pump stage to control switching on/off the charge-pump stage as a function of a configuration signal that determines the value of the boosted negative voltage;
    a decoding stage, configured so as to decode address signals received at its input and to generate biasing signals for addressing and biasing the memory cells, based on the decoded address signals and, in at least one given operating condition, of the boosted negative voltage; and
    a negative voltage management module having a regulator stage, configured to receive the boosted negative voltage from the charge-pump stage and to generate a regulated negative voltage for the decoding stage, having a lower ripple as compared to the boosted negative voltage generated by the charge-pump stage, wherein the regulated negative voltage generated by the regulator stage has a value that is a function of the boosted negative voltage, according to the following expression:

$$V_{neg\_reg}=V_{neg\_pump}+\Delta V$$

where the value of the boosted negative voltage is determined by the configuration signal, and $\Delta V$ is a voltage deviation of a desired value.

7. The circuit according to claim 6, wherein the regulator stage is configured to receive a regulation voltage from the control stage and to generate the voltage deviation as a function of the regulation voltage.

8. The circuit according to claim 7, wherein the control stage is configured to receive a voltage reference, of a stable and pre-determined value, and to generate the regulation voltage as a function of the voltage reference, and wherein the regulator stage is configured to generate the voltage deviation having a value that is a function of the voltage reference.

9. The circuit according to claim 8, wherein the voltage deviation is equal to an integer multiple of the voltage reference.

10. The circuit according to claim 8, wherein the voltage deviation is equal to a fraction of the voltage reference.

11. The circuit according to claim 8, wherein the control stage comprises:
an input amplifier, having a first input designed to receive the voltage reference, a second input connected to a reference terminal through a reference resistor having a pre-set value of resistance, and an output designed to supply the regulation voltage; and
a matched transistor having a control terminal designed to receive the regulation voltage and a current-conduction terminal connected to the reference resistor for generating, through the reference resistor, a reference current; and
wherein the regulator stage comprises:
a regulation transistor, which is made to be matched with the matched transistor and has a control terminal that receives the regulation voltage and a current-conduction terminal coupled to the reference terminal through at least one first reference resistor having a value of resistance that is a function of the pre-set value of resistance so as to generate on the first reference resistor a voltage drop defining the voltage deviation.

12. The circuit according to claim 7, wherein the regulator stage comprises:
an input block configured to receive the regulation voltage and the boosted negative voltage and to generate an internal voltage that is a function of the voltage deviation and of the boosted negative voltage;
a voltage-follower block, configured to transfer on an output terminal the internal voltage as the regulated negative voltage; and
a filtering block configured to implement a low-pass filtering operation on the internal voltage.

13. The circuit according to claim 12, wherein the voltage-follower block comprises:
a linear amplifier, having a first differential input that receives the internal voltage, a second differential input connected to the output terminal on which the regulated negative voltage is supplied, and a respective output; and
an output transistor, in source-follower configuration, which is coupled between an input terminal that receives the boosted negative voltage and the output terminal, and has a control terminal connected to the respective output of the linear amplifier.

14. The circuit according to claim 13, wherein the regulator stage further comprises a protection transistor arranged between the output terminal and the output transistor and has a control terminal that receives a biasing voltage having a value that is a function of a control signal.

15. A non-volatile memory device, comprising a memory array, and an address decoder circuit according to claim 6, the address decoder circuit coupled to the memory array and designed to address and bias the memory cells of the memory array.

16. The memory device according to claim 15, wherein the address decoder circuit implements a row decoder for addressing word lines of the memory array.

17. An method for addressing memory cells of a memory array of a non-volatile memory device, the method comprising:
generating a boosted negative voltage via a charge-pump stage;
controlling switching-on/switching-off of the charge-pump stage, as a function of a configuration signal that determines the value of the boosted negative voltage;
receiving address signals and decoding the address signals so as to generate biasing signals for addressing and biasing the memory cells, based on the decoded address signals and, in at least one operating condition, of the boosted negative voltage; and
generating a regulated negative voltage starting from the boosted negative voltage received from the charge-pump stage, the regulated negative voltage having a lower ripple as compared to the boosted negative voltage generated by the charge-pump stage.

18. The method according to claim 17, wherein generating the regulated negative voltage comprises generating the regulated negative voltage having a value determined by the same configuration signal as used for determining the value of the boosted negative voltage.

19. The method according to claim 17, further comprising receiving the boosted negative voltage from the charge-pump stage and the regulated negative voltage from the regulator stage and supplying alternatively the boosted negative voltage or the regulated negative voltage to bias the memory cells in the at least one operating condition.

20. The method according to claim 17 wherein the regulated negative voltage has a value that is a function of the boosted negative voltage, according to the following expression:

$$V_{neg\_reg} = V_{neg\_pump} + \Delta V$$

where the value of the boosted negative voltage is determined by the configuration signal, and $\Delta V$ is a voltage deviation of a desired value.

* * * * *